United States Patent [19]
Davis et al.

[11] Patent Number: 5,977,831
[45] Date of Patent: Nov. 2, 1999

[54] HYBRID SYSTEM FOR CONTROL AND MONITORING OF AN AMPLIFIER

[75] Inventors: Carlton Daniel Davis, Baltimore; Joseph Wayne Dodd, Catonsville; Thomas Steve Dominick, Glen Burnie, all of Md.

[73] Assignee: CBS Corporation, Pittsburgh, Pa.

[21] Appl. No.: 09/054,386

[22] Filed: Apr. 3, 1998

[51] Int. Cl.⁶ .................................................. H03G 3/10
[52] U.S. Cl. .......................................... 330/279; 330/129
[58] Field of Search ...................................... 330/136, 129, 330/279, 284, 207 P, 298, 289, 51

[56] References Cited

U.S. PATENT DOCUMENTS

| | | | |
|---|---|---|---|
| 3,668,556 | 6/1972 | Harbeson | 331/109 |
| 3,900,823 | 8/1975 | Sokal et al. | 330/149 |
| 4,165,493 | 8/1979 | Harrington | 330/207 P |
| 4,631,491 | 12/1986 | Smithers | 330/149 |
| 4,916,407 | 4/1990 | Olver | 330/151 |
| 5,101,173 | 3/1992 | DiPiazza et al. | 330/136 |

*Primary Examiner*—Robert Pascal
*Assistant Examiner*—Henry Choe
*Attorney, Agent, or Firm*—Robert P. Lenart; Eckert Seamans Cherin & Mellott, LLC

[57] ABSTRACT

A hybrid system (18) for control and monitoring of an amplifier (330) is provided. The hybrid control system (18) includes an analog control subsystem (81) and a digital control subsystem (82). The analog control system provides an automatic gain control loop for maintaining the gain of amplifier (330) at a predetermined level. The digital control subsystem (82) monitors a plurality of operating characteristics of amplifier (330) and commands the analog control subsystem (81) to reduce the gain of amplifier (330) responsive to certain predetermined fault conditions. The digital control subsystem (82) shuts down amplifier (330) responsive to other predetermined fault conditions. The digital control subsystem (82) also controls the power-on sequence and power-down sequence for amplifier (330), insuring that the gate bias voltage is first applied or maintained before the drain voltage is applied or removed.

21 Claims, 3 Drawing Sheets

HYBRID SYSTEM FOR CONTROL AND MONITORING OF AN AMPLIFIER

BACKGROUND OF THE INVENTION

1. Field of the Invention

The subject invention relates to a controller for an amplifier. More particularly, the subject invention is directed to a system for monitoring, protecting, and controlling an amplifier. Further, the subject invention is directed to the monitoring and controlling of a high power amplifier implemented using silicon carbide transistor technology. Even further, the subject invention directs itself to a monitor and control system including hybrid digital and analog control circuitry to provide an integrated, flexible architectural solution to the monitoring, protection and control of a silicon carbide high power amplifier. The amplifier of the present invention is suited to exemplary applications including, but not being limited to, analog and digital communications, radar transponding, position locating, and standard and high definition digital television broadcasting.

2. Prior Art

Various monitoring and control systems for amplifiers are known in the prior art. For instance, analog automatic gain control loops are known which include the sampling of the input and output of an amplifier, the gain of which is to be controlled, these sampled signals being used by an analog gain loop controller to maintain a predetermined gain of the amplifier. However, such prior art systems fail to concurrently provide along with the analog control loop, sufficient monitoring of the amplifier's other critical operational parameters such as gate voltage, drain voltage and current, and VSWR, to insure safe and effective operation of the amplifier.

Also known in the art are monitoring circuits that monitor the gate and drain of an amplifier, however, such prior art systems fail to teach an integrated operating scheme whereby analog control loops are coupled to and controlled by a digital monitoring and control subsystem for providing a flexible solution for the necessary control, monitoring and protection of the subject amplifier.

SUMMARY OF THE INVENTION

It is an object of the present invention to provide a controller for an amplifier wherein the controller monitors, protects and controls the amplifier and the various components thereof.

A hybrid system for control and monitoring of an amplifier is provided. The hybrid system includes an amplifier having an amplification input, a gain control input and an amplified output. The amplifier has a gain value varied responsive to a gain control signal input to the gain control input. The hybrid system also includes an analog control subsystem having (a) a first input coupled to the amplification input for sensing an input signal amplitude, (b) a second input coupled to the amplified output for sensing an output signal amplitude, and (c) an output coupled to the gain control input of the amplifier for maintaining a predetermined gain of the amplifier. The analog control subsystem generates the gain control signal as a function of a measured gain value relative to a reference gain value. A monitoring subsystem is coupled to the amplifier for detecting at least one fault condition thereof and output of a digital signal responsive thereto. The hybrid system also includes a digital control subsystem having at least one input coupled to the monitoring subsystem and a gain change output coupled to a third input of the analog control subsystem for changing the reference gain value responsive to the at least one fault condition.

Looking at the hybrid system for control and monitoring of an amplifier from another aspect, such can be seen to include a power source. The power source provides a gate voltage supply, a drain voltage supply, and a voltage reference. The hybrid system includes an amplifier coupled to the power source and has an amplification input, a gain control input, and an amplified output. The amplifier has a gain value varied responsive to a gain control signal input to the gain control input. The amplifier includes a plurality of transistors, each of the plurality of transistors having a gate element coupled to the gate voltage supply, a drain element coupled to the drain voltage supply, and a source element coupled to the voltage reference. The hybrid system further includes a switching circuit coupled between the drain voltage supply and the drain element of each of the plurality of transistors for coupling the drain voltage supply to the drain elements responsive to a switching control signal coupled to a switching control input of the switching circuit. An analog control subsystem is provided and has (a) a first input coupled to the amplification input for sensing an input signal amplitude, (b) a second input coupled to the amplified output for sensing an output signal amplitude, (c) an enabling input, and (d) an output coupled to the gain control input of the amplifier for maintaining a predetermined gain of the amplifier. The analog control subsystem generates the gain control signal as a function of a measured gain value relative to a reference gain value and an enable signal input to the enabling input. The analog control subsystem maintains a minimal gain of the amplifier responsive to a disable signal input to the enabling input. A monitoring subsystem is provided that is coupled to the amplifier for detecting a gate voltage of the gate voltage supply and output of a first digital signal responsive thereto. The monitoring subsystem detects a drain voltage of the drain voltage supply and outputs a second digital signal responsive thereto. The hybrid system further includes a digital control subassembly having a plurality of inputs coupled to the monitoring subassembly and a first output coupled to the enabling input of the analog control subsystem and a second output coupled to the switching control input of the switching circuit. The digital control subsystem outputs the switching control signal at the second output responsive to detection of the gate voltage and then in sequence changes an output at the first output of the digital control subsystem from a disable signal to an enable signal, responsive to detection of the drain voltage.

Therefore, in its broadest aspect, the instant invention defines a power amplifier and control module assembly that includes an amplifier, and an analog control subsystem, and a digital control subsystem. The amplifier includes a plurality of silicon carbide transistors coupled between an input and output thereof. The amplifier also includes means for varying a gain value thereof responsive to an analog signal input to a gain control input. The analog control subsystem has a pair of sensing inputs respectively coupled to the input and output of the amplifier and has an output coupled to the amplifier's gain control input. The analog control subsystem generates the gain control signal as a function of a measured gain value relative to a reference gain value. The digital control subsystem has a plurality of inputs coupled to the amplifier for monitoring predetermined operating characteristics thereof. The digital control subsystem has an output coupled to the analog control subsystem for commanding the analog control system to vary the gain value to a predetermined value responsive to establishing one or more of the predetermined operating characteristics as exceeding predetermined limits therefor.

DESCRIPTION OF THE PREFERRED EMBODIMENTS

Referring to the Figures, there is shown a power amplifier and control module assembly providing high power, high frequency output with improved reliability. Each assembly achieves high gain and is capable of operation in the UHF band of the electromagnetic spectrum. Although well-suited to many amplification applications, the power amplifier and control module assembly of the instant invention is particularly well-suited for use in the amplification stages of digital broadcasting transmitters, like the type utilized for broadcasting high definition television signals. By virtue of the hybrid control system 18, the amplifier is able to operate efficiently and reliably, wherein an analog control subsystem 81 provides an automatic gain control function, maintaining the amplifier's gain at a predetermined value. The digital control subsystem 82 monitors a plurality of the amplifier's operating parameters and outputs control signals to the analog control subsystem 81 to change the gain value to which the amplifier is maintained or to shut it down. The digital control subsystem also controls the start-up and shut-down sequence for the amplifier, ensuring that the transistor devices of the amplifier are not exposed to deleterious bias conditions. Still further, the amplifier and control module assembly provides communications to an external monitoring system 500 for transmitting the operational status and alarm conditions thereto. Thus, in a large system made up of many such amplifier and control module assemblies, the communications between each control module and the remote monitoring system 500 reduces the time required for fault isolation.

Figure 3:
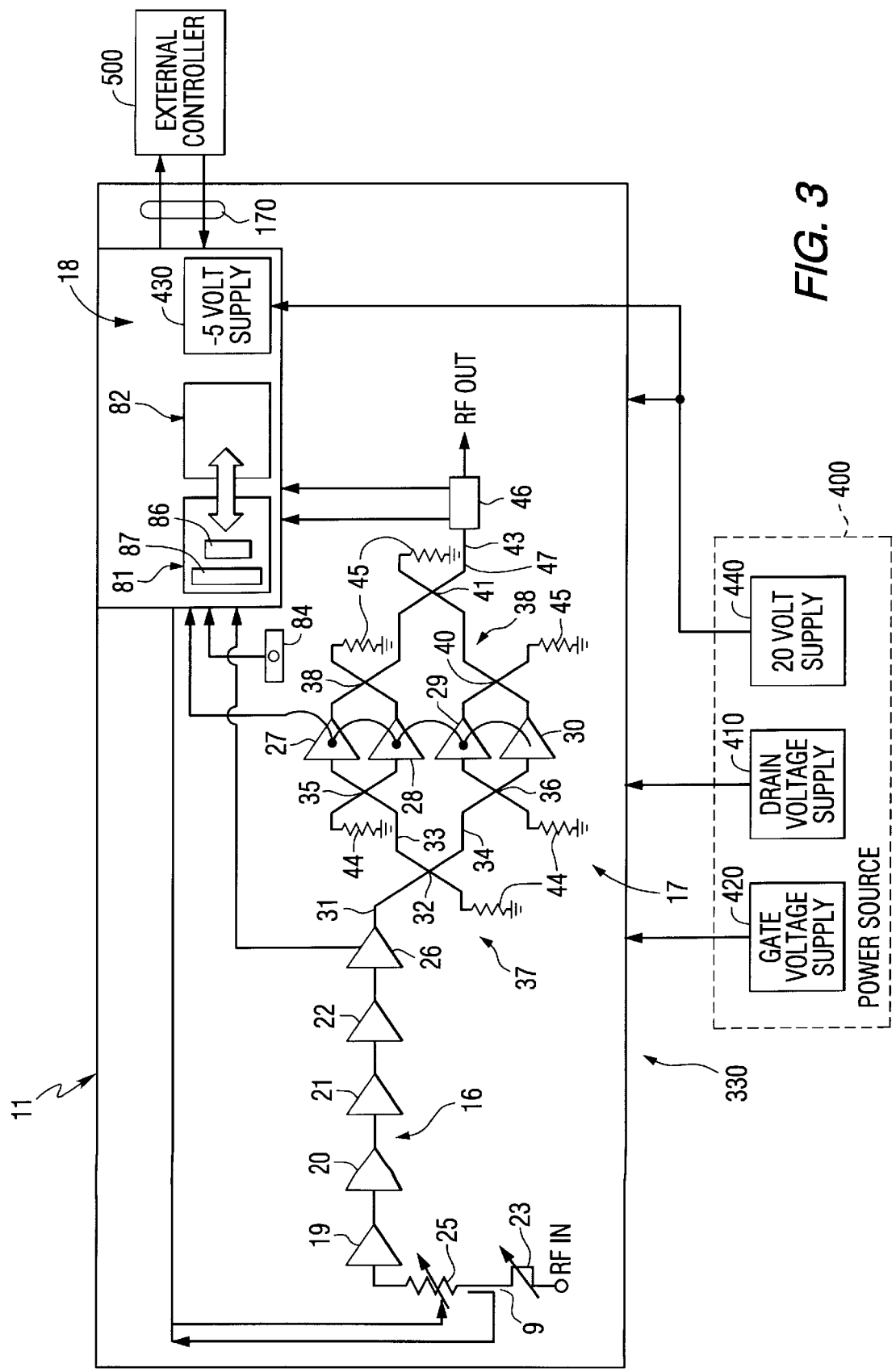

Referring to FIG. 3, there is shown the assembly of power amplifier 330 and control module 18. Power amplifier 330 may be formed of a preamplifier stage 16 and a power driver stage 17. The preamplifier stage 16 includes a plurality of amplification stages, and in one working embodiment four cascaded stages 19, 20, 21, and 22 were included. The power driver stage 17 of amplifier 330 may also include multiple stages. In one working embodiment, the power driver stage 17 was formed by a one driving four configuration. Thus, the output from preamplifier stage 22 is coupled to a first driver transistor circuit 26 which in turn drives four parallel transistor circuits 27, 28, 29, and 30. Each of the transistor circuits 26–30 includes a silicon carbide transistor.

The transistor circuit 26 is coupled to the input of each of the four transistor circuits 27–30 through a quadrature hybrid 37, which splits the signal and shifts the phase of the signal delivered to each of the respective transistor circuits. Quadrature hybrid 37 is formed by a first coupler 32 which splits the signal and provides the split signals to the inputs 33 and 34 of couplers 35 and 36. The signals input to couplers 35 and 36 are shifted in phase by 90°, one with respect to the other. Coupler 35 similarly splits the signal input thereto into two respective signals which are phase shifted by 90°, one with respect to the other. Coupler 36 likewise splits the signal input thereto into two signals which are shifted in phase by 90°, one with respect to the other. Each of the couplers 32, 35 and 36 are provided with appropriate termination resistors 44.

The signal output from each of the transistor circuits 27, 28, 29, and 30 are combined to form a single amplified output signal in a second quadrature hybrid 38. Quadrature hybrid 38 is formed by combiners 39, 40 and 41. The output of each of transistor circuits 27 and 28 are input to the combiner 39, while the output of transistor circuits 29 and 30 are input to combiner 40. The output of each of combiners 39 and 40 are each respectively coupled to an input of the combiner 41, wherein the output 47 represents the in-phase addition of the amplified signals from each of the transistor circuits 27–30. The output 47 of combiner 41 is coupled to the directional coupler 46 through a microstrip line 43. The combiners 39, 40, and 41 are terminated with appropriate resistors 45, as is well-known in the art. To maintain the gain of amplifier 330 at a predetermined value, the control system 18 includes an analog control subsystem 81, which functions as an automatic gain control for the amplifier. Coupler 46 provides an output to the analog control system 81 which represents the output power level delivered thereto. An input power detector 9 is located at the input to amplifier 330 and provides a sample of the input power level to the analog control subsystem 81. Responsive to changes in the measured gain, an analog controller 86 outputs a signal to amplifier 330 to adjust the gain thereof. The gain control signal output from the analog controller 86 may be used to vary the signal supplied to transistor circuits within amplifier 330 to alter the gain thereof, or utilized to control a variable attenuator. In one working embodiment, a variable attenuator 25 was coupled to an input of the amplifier 330 and controlled responsive to an output signal from the analog controller 86. Attenuator 25 may be coupled in series with a variable phase shifter 23 and the input power detector 9, in any order. A power source 400 is defined by a gate voltage supply 420, drain voltage supply 410 and 20 volt supply 440, which supplies provide the required power to module 11. The 20 volt supply 440 supplies voltage to the circuits of the analog control subsystem 81 and digital subsystem 82. The control module 18 includes circuitry for output of −5 volts from the 20 volts provided from supply 440. That circuitry, in −5 volt supply 430, also is supplied to the circuits in analog control system 81 and digital subsystem 82.

The controller 18 further includes a digital control subsystem which monitors the input power level, the output power level, the voltage standing wave ratio at the output, the temperature of the module 11 by means of a sensor 84, the operating condition of each of the transistor circuits 26, 27, 28, 29, and 30, as well as the gate and drain voltage levels supplied thereto. The digital control subsystem 82 is programmed to detect such fault conditions as: high or low input power; high or low output power; high reverse power; over-temperature; power supply failures; and a failure in one or more of the transistor circuits 26–30. Responsive to detection of a fault condition, the status thereof is communicated to an external monitoring system through a communications data link 170. Under certain circumstances, the digital control subsystem 82 will shut down amplifier 330 responsive to a detected fault condition. In other circumstances, the digital control subsystem 82 will command the analog control system 81 to reduce the gain of amplifier 330, thereby altering the gain reference value utilized by the analog controller 86 in its AGC loop.

Figure 1:
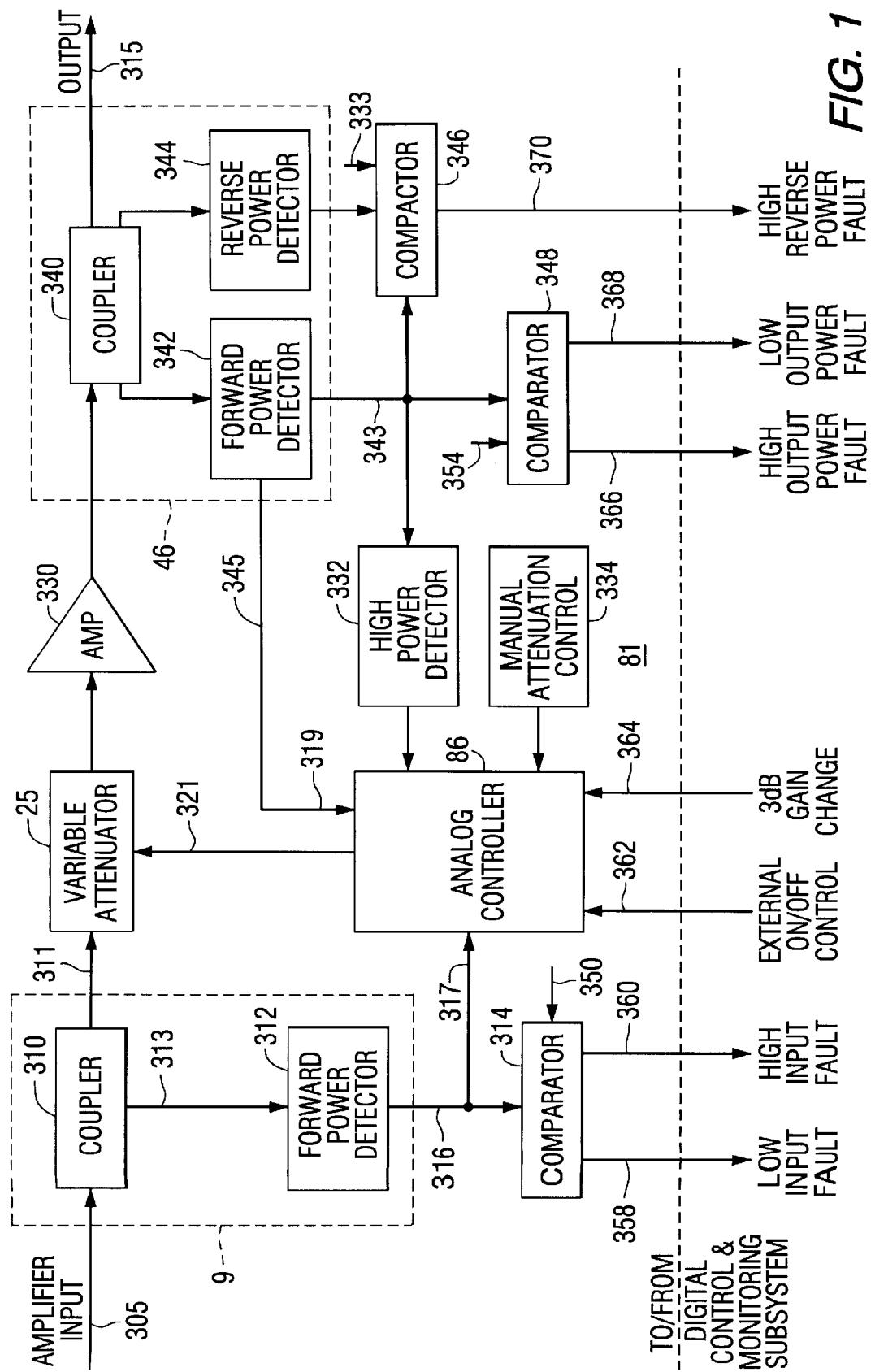
FIG. 1 is an electrical block diagram showing the analog portion of the present invention and its interface to the digital subsystem.

Referring now to FIGS. 1 and 3, a radio frequency (RF) signal 305 to be amplified is provided to the input of the amplifier and control module 11. This signal is typically an analog or digitally modulated RF signal having a frequency within a range extending from the low Megahertz to the low Gigahertz. RF input signal 305 is first provided to an input of RF sampling coupler 310 that couples the RF signal input thereto to a first output 311, and to a second sampled RF output 313. The sampled RF output at 313 is fed to the analog control subsystem 81 and in particular to an input of a forward power detector 312 that detects the power level of the sampled RF signal provided thereto by coupler 310 and together therewith defines input power detector 9. Forward power detector 312 is implemented as a Schottky diode detector that provides a DC voltage level at an output 316 of the forward power detector 312 indicative of the sampled RF power input thereto. The DC voltage level presented at the output 316 of the forward power detector 312 is provided to both an input of the circuit comparator 314 and to an input 317 of analog controller 86.

The RF input signal passing through coupler 310 to the first output 311 thereof is next input to a variable attenuator 25, implemented in one working embodiment thereof as a voltage controlled attenuator. Analog controller 86 provides a voltage control signal to a control input 321 of variable attenuator 25 for varying the amount of attenuation introduced thereby, thus correspondingly varying the attenuation of the RF signal passing therethrough.

The RF output of variable attenuator 25 feeds the input of high power amplifier 330 used to amplify the RF signal input thereto. The amplified RF output of amplifier 330 is input to an output sampling coupler 340 which provides at a first output 315 thereof an amplified version of the RF input signal 305 initially introduced at the input to the amplifier and control module 11. Sampling coupler 340 provides at a second output thereof an RF signal sample that is input to a forward power detector 342, which, similar to forward power detector 312, provides a DC voltage level to both outputs 343 and 345 thereof indicative of the RF power level input to the forward power detector 342. The forward power DC voltage level at output 343 of power detector 342 is provided to an input of high power detector 332, to an input of comparator circuit 348, and to an input of comparator circuit 346. High power detector 332 may be implemented with a comparator having a predetermined reference voltage coupled thereto. The forward power DC voltage level at output 345 of power detector 342 is provided as a feedback signal to an input 319 of analog controller 86.

Coupler 340 also provides at a third output thereof, an RF signal sample representative of RF signal power reflected back toward output 315 of coupler 340. A reverse power detector 344 is coupled to this third output. Reverse power detector 344 is similar to power detectors 312 and 342, and comprises a Schottky diode detector that provides a DC voltage level at an output thereof indicative of the reflected power incident to the output 315 of coupler 340. This DC voltage level is provided to an input of the comparator circuit 346. Together, coupler 340 and power detectors 342 and 344 define the directional coupler 46 of FIG. 3.

To each of comparator circuits 314, 346, and 348, is provided a respective DC voltage reference source 350, 333, and 354, against which reference the respectively sampled DC voltage levels input to the respective comparator circuits 314, 346, and 348 are compared. The comparator circuits 314 and 348 may each include a plurality of commercially available voltage comparators with DC voltage reference source 350, 354 appropriately divided to provide respective high and low limit outputs.

Thus, in practice, each comparator circuit will have input thereto as many DC voltage reference level inputs as are necessary to satisfy the requirements of the comparator function described herein, or include a circuit to divide an input reference voltage appropriately. While the comparators can be implemented using analog circuitry, including operational amplifiers, or voltage comparator circuits, and resistive dividers, the comparator functions can be implemented using analog-to-digital converters (for converting input voltages to digital word format) and comparative digital logic or software routines run in a microprocessor.

Comparator circuit 314 provides a pair of digital status signals at a respective pair of outputs 358 and 360. Particularly, comparator circuit 314 provides a low input power fault output 358 that is asserted when the level of the RF input signal 305, coupled to the RF input of coupler 310, falls below a predetermined low signal reference level. The high input power fault output 360 is asserted when the same RF input signal is above a respective predetermined high signal reference level Comparator circuit 348 provides a similar function to that provided by comparator circuit 314. Particularly, a pair of digital status signals, high output power fault output 366 and low output power fault output 368. High output power fault output 366 is asserted when the amplified RF signal power output from amplifier 330 exceeds a predetermined high output signal reference value. Conversely, low output fault output 368 is asserted when this same amplified signal level falls below a respective predetermined low output signal threshold value.

Comparator circuit 346 provides a high reverse power fault output 370 (high VSWR output). That status signal is asserted when the reverse or reflected RF signal power relative to the forward output power, sampled by coupler 340, exceeds a predetermined level.

High power detector 332 is employed in the analog control subsystem to limit the maximum output power of amplifier 330 to a predetermined upper level. In one working embodiment, the maximum output power threshold was set at 2 dB above nominal. If the output power of amplifier 330, as detected by power detector 342, exceeds the predetermined threshold, as established by DC voltage reference 333, then such is fed back to analog controller 86. Responsive to that indication, analog controller 86 takes the action necessary to reduce, e.g., limit, the output power of amplifier 330 (as for example by commanding variable attenuator 25 to an increased attenuation state).

Thus, comparator circuits 314 and 348 monitor respectively the RF signal levels at the input and output of amplifier 330 and provide corresponding digital fault status signals when the input and output signal levels fall outside of predetermined ranges. Similarly, comparator circuit 346 monitors reflected or reverse RF signal power and compares such to the output power line to provide a VSWR digital fault status signal indicative of excessive reflected power, and high power detector 332 serves to limit at an upper level, the output power of amplifier 330.

Additionally, the analog controller 86 provides an automatic gain control function whereby the overall gain established between input sampling RF coupler 310 and output sampling RF coupler 340 is maintained at a predetermined level. The automatic gain control loop, in broad concept, operates as a feedback control loop that:

1) monitors the RF signal level present at the input to variable attenuator 25 (this RF signal level is represented by the DC voltage level provided at the output of power detector 312) and the RF signal level present at the output of amplifier 330 (represented by the DC voltage level provided at the output of power detector 342);

2) compares these two levels; and then 3) generates a control voltage (error signal) responsive to this comparison between the input and the output levels to thus maintain a constant predetermined gain for the loop.

In particular, a voltage $V_{OUT}$, representative of the RF signal power at the output of amplifier 330, is detected by power detector 342, and is provided to analog controller 86. Similarly, a voltage $V_{IN}$, representative of the RF signal power level provided to the input of variable attenuator 25, is detected by power detector 312, and is, together with the voltage $V_{OUT}$, provided to analog controller 86.

Analog controller 86 includes the analog control circuitry necessary to maintain the overall operating gain of the loop, defined by the error voltage, $V_{OUT}-V_{IN}$, at a predetermined gain level. In particular, analog controller 86 includes the analog circuitry required to generate the appropriate voltage gain control signal, provided to the control input of variable attenuator 25, to maintain a predetermined substantially constant gain between the input of variable attenuator 25 and the output of amplifier 330. Even more particularly, analog controller 86 includes the analog circuitry required to perform at least the following functions: scale the voltages ($V_{IN}$, $V_{OUT}$) input thereto; provide comparative logic to the voltages input thereto; provide an error signal output used to drive variable attenuator 25; establish the loop bandwidth of the gain control loop at a level that is sufficiently high to provide effective overall gain control, but that is sufficiently low, of for example 10 Hz, so as not to interfere with the signal modulation riding on the RF input signal 305; and, provide the necessary driver circuitry, at the output of analog controller 86 to control variable attenuator 25, that under fault conditions quickly drives the variable attenuator to a maximum attenuation state, thus protecting amplifier 330 from damaging fault conditions. By appropriate scaling of $V_{OUT}$, a zero error voltage represents the desired gain level. That scaling is changed responsive to input of a control signal from the digital subsystem 82, as will be described in following paragraphs.

The following example serves to further illustrate the operation of the gain control loop. If, for instance, due to operational temperature variation, the gain of amplifier 330 were to increase, thus causing the overall gain (as measured between the input of variable attenuator 25 and the output of amplifier 330) to increase above the predetermined gain level, a corresponding increase in the voltage $V_{OUT}$ would be detected by analog controller 86. Responsive to this increase in $V_{OUT}$ without a corresponding increase in $V_{IN}$, analog controller 86 increases the level of attenuation provided by attenuator 25 by adjusting the gain control voltage supplied thereto, thereby decreasing the input drive to amplifier 330 (provided at the output of variable attenuator 25), which of course decreases the output level $V_{OUT}$ of the amplifier, thus bringing the overall gain back to the predetermined gain level.

Thus, in this embodiment, the variable attenuator 25 operates as the variable gain component in the gain control loop. However, it should be appreciated that the need for a variable gain stage can just as easily be met through the use of a variable gain amplifier stage or stages as part of amplifier 330. In such an arrangement, analog controller 86 provides to the variable gain amplifier stage the necessary control voltage for adjusting the gain thereof, just as it provides a gain control voltage to the variable attenuator 25. Alternatively, any of the transistor circuits comprising amplifier 330 (see FIG. 3) could themselves be implemented so as to incorporate gain varying circuit elements that are responsive to the gain control signal output from analog controller 86.

Provided to inputs 362 and 364 of analog controller 86 are a pair of command signals from the digital control subsystem 82. An external on/off control signal is coupled to input 362, and a 3 dB gain change control signal is coupled to input 364. Analog controller 86 responds to the asserted state of external on/off control signal at input 362 by commanding the variable attenuator 25 to a maximum attenuation state if the signal represents an "off" state. When the attenuation introduced by variable attenuator 25 is maximized, the RF signal input to amplifier 330 is effectively removed, the gain being reduced at least 30 dB. Thus, in this case, the external on/off control signal, analog controller 86, and variable attenuator 25, cooperate to effectively switch-off the RF input signal drive to the input of amplifier 330. Where other circuit elements provide the variable gain, such would similarly be driven to a minimal, or zero, gain state.

The 3 dB gain change signal, when provided to input 364 of analog controller 86, causes a change in the reference gain level for the AGC loop. While this change is illustrated as being a reduction of 3 dB, other levels of change could be utilized. In one working embodiment, the AGC reference level is predetermined for a gain level of approximately 41 dB +/−0.5 dB, and responsive to the gain change control signal input to analog controller 86, through input 364, the gain level reference is set 3 dB below the prior 41 dB level, such being set by changing the scaling of the sampled $V_{OUT}$. Alternatively, a plurality of gain change commands can be used to effect a corresponding plurality of predetermined gain levels, i.e., multiple 3 dB steps.

Figure 2:
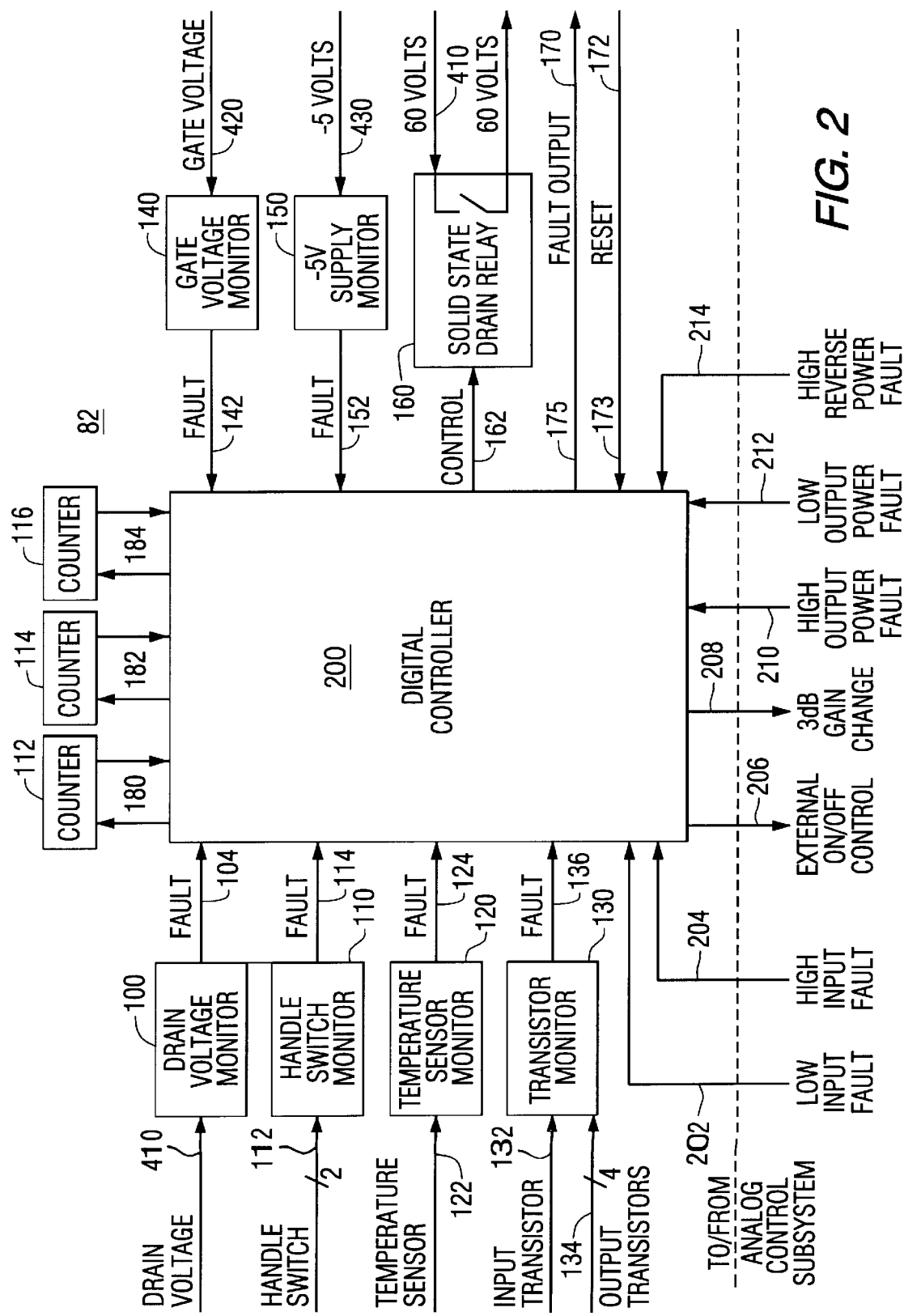
FIG. 2 is an electrical block diagram of the digital subsystem of the present invention and its interface to the analog portion thereof; and, FIG. 3 is a schematic diagram showing the power amplifier and control module assembly of the present invention.

Referring to both FIGS. 2 and 3, operating power (operating current and voltage) is provided to each of the transistor circuits 26–30. Particularly, the switched drain voltage output, provided by the switched solid state drain relay 160 is coupled to respective drains of transistor circuits. Further, a gate voltage supply 420 is provided to bias circuits for the gates of each of the amplifier's transistors and to a monitor circuit 140.

Even further, each of the transistor circuits 26–30 is coupled to a transistor failure detection monitor circuit 130, for detecting an operational failure of any of those transistors. The monitored operational characteristic, such as drain current, is coupled to the four inputs 134 for the transistors of transistor circuits 27, 28, 29, and 30. Similarly, the sensed drain current of input transistor 26 is coupled to the input. As is well-known in the art, drain current can be measured by measuring the voltage drop across a resistor coupled in series with the drain lead of the associated transistor.

As shown in FIG. 2, the digital control and monitoring subsystem 82 includes digital controller 200 which provides particular control and monitoring functions of system 18. Digital controller 200 may comprise a microprocessor or microcontroller, gate array or ASIC chip, Field Programmable Logic Array, or other Programmable Array Logic device, or a logic circuit formed of discrete digital logic devices. It is the functionality and high speed response that is important, not the particular architecture used to implement controller 200. With regard to monitoring functions, digital controller 200 monitors a plurality of system operational parameters through a variety of monitoring circuits, each of the monitoring circuit outputs providing a digital fault status to an input of the digital controller 200.

Drain voltage monitor 100 monitors the drain voltage provided to module 11 from drain voltage sup ply 410 of power source 400, and provides a digital fault signal to an input 104 of digital controller 200 responsive to a fault condition of the drain voltage. Particularly, when the drain voltage falls outside of a specified range, for instance, when the drain voltage falls outside the range of −50 to 75 volts, such is indicated to the digital controller 200.

Handle switch monitor circuit 110 monitors the status of one or more switches mounted on the housing of module 11 for sensing an attempt to remove module 11 from the rack or housing into which it is installed. When the signal input to input 112 of switch monitor circuit 110 provided by the switch or switches indicates actuation thereof, such status is coupled to input 114 of digital controller 200.

Temperature sensor monitor circuit 120 has input thereto a signal indicative of a temperature value provided by a temperature sensor 84 located in proximity to amplifier 330. Responsive to an over-temperature condition as sensed by the temperature sensor 84, temperature sensor monitor circuit 120 provides an over-temperature fault indication signal to input 124 of digital controller 200.

Transistor monitor circuit 130 monitors predetermined operational characteristics of the transistors of transistor circuits 26–30 of amplifier 330. Responsive to predetermined failure conditions of the monitored transistors, transistor monitor circuit 130 provides corresponding fault indication signals to input 136 of digital controller 200. Transistor monitor circuit 130 distinguishes the failure status of the transistor of each transistor circuit 26–30, rather than provide a single fault status signal when any transistor fails.

Gate voltage monitor circuit 140 monitors gate voltage provided by the gate voltage supply 420 for at least the following gate voltage conditions: loss of or low gate voltage; excessive gate voltage; and, reverse gate voltage. Particularly, in one working embodiment, gate voltage monitor circuit 140 continuously monitors a −20V gate voltage for high or low gate voltages using two separate threshold detection circuits. If the gate voltage drops below −18V or rises above −24V a fault signal is output to input 142 of digital controller 200.

The −5V supply monitor circuit 150 is provided for monitoring a −5V power supply 430, the output being produced by a regulator internal to the supply. If the supply voltage falls below a predetermined level, such as −4.5V, monitor circuit 150 provides a fault indication to input 152 of digital controller 200. Note that the −5V power supply output provides operating power to various analog and digital circuits in the subsystems 81 and 82 of module 11.

In addition to the above-mentioned fault monitoring inputs, digital controller 200 has an output 162 coupled to a control input of solid state drain relay 160 and provides thereto a relay control signal for controlling the on/off state thereof. In this manner, digital controller 200 can selectively apply the drain voltage from supply 410 to the drains of the transistors of amplifier 330, thus selectively turning on (or off) the amplifier 330.

Further in addition to receiving various fault monitoring inputs and control outputs, digital controller 200 is provided with a signal interface 175 coupled to an external monitoring system or controller 500 through a data link 170. Data link 170 may be a serial communications interface or a parallel data bus. To this end, digital controller 200 provides a fault status output signal to the external controller, and additionally may receive therefrom a reset signal 172 at an input 173 for resetting the logic in the digital controller 200 after power-on thereof, and for resetting faults reported thereby to the external controller 500.

The digital subsystem 82 further includes a plurality of resettable counters or timers 112, 114 and 116 that are respectively coupled to digital controller 200 to input and outputs at 180, 182, and 184. The counters provide various delays, or elapsed times, that output to digital controller 200 for the operational sequencing and synchronization thereof. The counters or timers 112, 114, and 116 can be implemented as software modules in a microprocessor controller 200.

With regard to the analog control subsystem (FIG. 1), the various digital status signals output by the comparator circuits 314, 346, and 348 are provided as inputs to digital controller 200. Thus, digital controller 200 receives the low input fault output 358 at an input 202, high input fault output 360 at an input 204, high output power fault output 366 at an input 210, low output power fault output 368 at an input 212, and high reverse power fault output 370 at an input 214. The output of high power detector 332 may also be coupled to digital controller 200. In turn, digital controller 200 provides an output 206 for the on/off control signal coupled to input 362 of analog controller 86, and an output 208 for the gain change signal coupled to the input 360 of analog controller 86.

Thus, as is readily revealed by the foregoing description of the digital controller 200 interfaces, a plurality of system status indication signals indicative of a corresponding plurality of system operational parameters are provided to digital controller 200, and in addition, digital controller 200 outputs control signals (commands) to the analog control subsystem 81, and to solid state drain relay 160. This hybrid architecture of the control system 18 permits digital controller 200 to assert control over the analog control subsystem 81 and solid state drain relay 160 responsive to a vast array of system operating conditions represented by the plurality of system status indication signals received thereby, to provide protection for the sensitive and high gain components of amplifier 330. The receipt of these independent system status indication signals by digital controller 200 enhances the flexibility thereof in effecting the monitoring, and operation and protective control of the various other components in the system of the present invention.

Digital controller 200 takes the following actions responsive to the condition of the system as represented by the various aforementioned status indication signals. With regard to the power level of RF input signal 305 provided to the input of the amplifier, digital controller 200 continuously monitors for the low input fault output 358 and high input fault output 360 which respectively indicate whether the RF input level is too low (below a predetermined reference level) or too high (above a predetermined level). When either of these fault signals is output, digital controller 200 initiates a predetermined time-out interval, for instance a three second time-out using one of the counters 112–116. If the fault signal is cleared before the predetermined time-out interval has elapsed, the counter is reset. If, however, the fault signal is received for at least the predetermined time-out interval, then digital controller 200 turns off amplifier 330 by opening the solid state drain relay 160, to thus remove drain voltage from the transistors of amplifier 330. Digital controller 200 also outputs a fault indication to the external controller 500.

With regard to the amplified RF output of amplifier 330, which output feeds the input of coupler 340, digital controller 200 continually monitors for a high output power fault output (indicating that the RF output power exceeds a predetermined level), a low output power fault output (indicating that the RF output power is below a predetermined level), and a high reverse fault output (indicative of an excessive voltage standing wave ratio (VSWR)). These fault signals further indicate to digital controller 200 whether the normal operating range of the AGC has been exceeded or is not working properly. Under any of these fault scenarios, digital controller 200 first commands analog controller 86, through output of the on/off control signal, to disable the RF input signal input to amplifier 333. Responsive to this disable command, analog controller 86 then drives variable attenuator 25 to assume a maximum attenuation state to effectively disable the RF signal input. After the input to amplifier 330 has been disabled, as detected by the various status output 366, digital controller 200 removes operating power from (turns off) amplifier 330 by opening the solid state drain relay 160. Digital controller 200 also provides a fault status indication signal to the external controller 500.

Regarding the temperature of amplifier 330, if monitor circuit 120 indicates that a predetermined temperature threshold has been exceeded, then digital controller 200 initiates a predetermined time-out interval of, for example, three seconds, using the counters 112, 114. If the high temperature fault is asserted throughout the time-out interval, or if the fault toggles more than a predetermined number of times within the time-out interval, then digital controller 200 commands analog controller 22 to reduce its currently established predetermined gain level by a predetermined increment, such as 3 dB, by output of the gain change signal to analog controller input 364. Further, digital controller 200 asserts a fault indication signal to the external controller 500. Essentially, the response to an over-temperature condition is a reduction in the overall gain provided by the amplifier 330 by an altering of the reference gain value in the AGC loop provided by analog controller 86.

Regarding physical removal of the module from a chassis or rack to which it is connected, digital controller 200 monitors the handle switch monitor fault output signal. If one or more of the switches of the module housing are activated, indicating potential removal of the module, then digital controller 200 commands analog controller 86 to disable the input RF drive, outputting a disable signal to the external on/off input 362 of analog controller 86. Subsequently, digital controller 200 removes operating power from amplifier 330 by opening solid state drain relay 160.

Digital controller 200 continuously monitors the input 152 for a fault signal provided by the −5V supply monitor circuit 150. If the −5V supply voltage falls below a predetermined value, such as −4.5 V, a fault signal is asserted to input 152 and responsive thereto, digital controller 200 initiates a predetermined time-out interval. If the fault condition clears, then the time-out period is reset. However, if the −5V voltage remains below the predetermined level for at least the time-out interval, then digital controller 200 commands analog controller 86 to disable the RF input to amplifier 330. Once the RF input has been disabled, digital controller 200 removes operating power from the amplifier by commanding solid state drain relay 160 to its open state. A fault indication signal is provided to the external controller 500.

Drain voltage monitor circuit 100 continuously monitors the drain voltage from the drain voltage supply 410 to determine if it is within a predetermined range, for example, between 50 and 75 volts. If the drain voltage falls outside of this range, then either a high or a low indication signal is asserted to the input 104. Responsive to assertion of this fault, digital controller 200 initiates a predetermined time-out interval, such as three seconds. If the asserted fault is cleared before the predetermined time-out interval has elapsed, the counter is reset. However, if the fault is asserted for the full predetermined time-out interval, while RF input 305 is present at a predetermined power level, then digital controller 200 commands analog controller 86 to disable the RF input to amplifier 330. Digital controller 200 outputs a fault indication that is transmitted to external controller 500.

Gate voltage monitor circuit 140 continually monitors for high or low gate voltage using two separate threshold detection circuits. If the magnitude of the gate voltage drops below a first predetermined level, for example −18 V, or rises above a second predetermined level, for example −24 V, a fault signal is output to input 142.

If the gate voltage fault signal represents an undervoltage fault, digital controller 200 commands analog controller 86 to disable the RF signal input to amplifier 330 by reducing input RF level a predetermined amount, for example less than 20 dB below the nominal RF input level. Once the analog control subsystem 81 indicates to digital controller 200 that the input level has in fact been reduced, digital controller 200 removes operating power from amplifier 330 by opening solid state drain relay 160. Digital controller 200 also transmits a fault indication to the external controller 500. Overall, this protection mechanism is designed to prevent drain voltage removal prior to a substantial reduction in the RF power input to amplifier 330.

If the gate voltage fault is one of over-voltage, then the only action taken by digital controller 200 is to transmit a fault indication to the external controller 500.

With regard to transistor failures in amplifier 330, transistor monitor circuit 130 provides fault status to digital controller 200. With reference to FIGS. 2 and 3, if any of the monitored transistors should fail, this failure status is provided to digital controller 200 by transistor monitor circuit 130. If the transistor of driver transistor circuit 26 fails, or if more than one of the transistors of output transistor circuits 27–30 fails, digital controller 200 commands analog controller 86 to disable the input RF to amplifier 330. Once the analog control subsystem 81 has indicated that the input RF signal has in fact been disabled, digital controller 200 removes operating power from the amplifier 330 by opening solid state drain relay 160.

If, on the other hand, only one of the transistors of output transistor circuits 27–30 fails, then digital controller 200 outputs a gain change command to analog controller 86. Thus the digital controller 200 commands the analog controller 86 to reduce the reference gain value for the AGC loop to operate the amplifier 330 at a gain level reduced by a predetermined increment below nominal. In either of these transistor failure scenarios, digital controller 200 provides a fault indication signal to the external controller 500.

In addition to the handling of the previously mentioned discrete system fault conditions, digital controller 200 further controls the power-on sequence for the amplifier (and its associated circuitry). An overriding concern addressed by this power-on sequence is to ensure that the gate voltage, as applied to the respective gates of the transistors of amplifier 330, is present at an acceptable operational level before the drain voltage is applied to the transistors.

The following sequence steps outline the power-on sequence established by the digital control and monitoring subsystem 82:

1. Coincident with the initial application of external power to both the digital control monitoring subsystem 82 and the analog control subsystem 81, a predetermined time-out interval is initiated, of for example, three seconds. During this predetermined time-out interval, fault monitoring and certain controls in the system are inhibited, but after the predetermined time-out interval has expired, the fault monitoring and controls become active. This time-out interval permits voltage levels of the power supplies to stabilize before the application of operating power is made to the amplifier, and it further ensures that monitoring functions are accurately reporting operational fault status rather than erroneous transient conditions incident to initial power-on.

During this predetermined time-out interval, critical control signals remain fixed in a predetermined state that prevents the improper application of operating power to the amplifier's transistors.

If during this time-out delay, reset signal 172 is received from the external controller, the signal is latched until the predetermined time-out interval has expired.

2. Once the reset signal has been asserted, the predetermined time-out time interval has elapsed, and the gate and drain voltages are at acceptable operating levels sufficient for proper operation of the amplifier, digital controller 200 applies operating power (drain voltage) to the transistors by closure of solid state drain relay 160.

3. After operating power has thus been applied to the transistors, digital controller 200 commands analog controller 86 to enable the RF signal input to amplifier 330. Note that prior to this point in the turn-on sequence, variable attenuator 25 has been held in a maximum attenuation state, thus disabling the RF input signal input to amplifier 330.

4. After the input RF signal has been enabled, digital controller 200 initiates a second predetermined time-out interval, of for example three seconds.

5. After the expiration of this second predetermined time interval, digital controller 200 determines, through status signals input thereto from analog subsystem 81, whether the operating gain level of the analog gain control loop is at its predetermined level.

6. Assuming no other system faults, the system enters normal operation.

In addition to supervising an orderly power-on sequence for the system, digital controller 200 similarly ensures an orderly power-down sequence. The power-down sequence executes, for the most part, the power-on sequence steps described above, but in a reverse order thereof.

Although this invention has been described in connection with specific forms and embodiment thereof, it will be appreciated that various modifications other than those discussed above may be resorted to without departing from the spirit or scope of the invention. For example, functionally equivalent element may be substituted for those specifically shown and described, proportional quantities of the elements shown and described may be varied, and in the formation method steps described, particular steps may be reversed or interposed, all without departing from the spirit or scope of the invention as defined in the appended Claims.

What is claimed is:

1. A hybrid system for control and monitoring of an amplifier, comprising:

an amplifier having an amplification input, a gain control input and an amplified output, said amplifier having a gain value varied responsive to a gain control signal input to said gain control input;

analog control means having (a) a first input coupled to said amplification input for sensing an input signal amplitude, (b) a second input coupled to said amplified output for sensing an output signal amplitude, and (c) an output coupled to said gain control input of said amplifier for maintaining a predetermined gain of said amplifier, said analog control means generating said gain control signal as a function of a measured gain value relative to a reference gain value;

monitoring means coupled to said amplifier for detecting at least one fault condition thereof and output of a "digital" signal responsive thereto; and, "digital" control means having at least one input coupled to said monitoring means and a gain change output coupled to a third input of said analog control means for changing said reference gain value responsive to said at least one fault condition.

2. The hybrid system as recited in claim 1 where said amplifier includes a plurality of transistors coupled in parallel relationship, said digital control means outputting a signal at said gain change output for reducing said reference gain value by a predetermined increment responsive to a failure of one of said plurality of transistors.

3. The hybrid system as recited in claim 2 where said predetermined increment is approximately 3.0 db.

4. The hybrid system as recited in claim 2 where said digital control means includes an enablment control output coupled to an enabling input of said analog control means, said analog control means maintaining a minimal gain of said amplifier responsive to a disable signal input to said enabling input, said digital control means outputting said disable signal responsive to a failure of at least two of said plurality of transistors.

5. The hybrid system as recited in claim 2 where said monitoring means includes a temperature sensor coupled to said amplifier, said digital control means outputting said signal at said gain change output for reducing said reference gain value by said predetermined increment responsive to a temperature sensed by said temperature sensor exceeding a predetermined temperature value.

6. The hybrid system as recited in claim 1 where said digital control means includes an enablement control output coupled to an enabling input of said analog control means, said analog control means maintaining a minimal gain of said amplifier responsive to a disable signal input to said enabling input.

7. The hybrid system as recited in claim 6 where said monitoring means includes means for monitoring said output signal amplitude, said output signal amplitude monitoring means including at least one output coupled to an input of said digital control means for output of a signal to said digital control means representing a fault condition of said analog control means when said output signal amplitude exceeds predetermined limits, said digital control means outputting said disable signal responsive to said fault condition of said analog control means.

8. The hybrid system as recited in claim 7 where said monitoring means includes means for monitoring a reflected signal amplitude at said amplified output of said amplifier, said reflected signal amplitude monitoring means including at least one output coupled to an input of said digital control means for output of a signal to said digital control means representing a fault condition defined by a voltage standing wave ratio in excess of a predetermined limit, said digital control means outputting said disable signal responsive to said fault condition signal.

9. The hybrid system as recited in claim 4 further comprising a power source, said power source providing a gate voltage supply coupled to respective gate elements of said plurality of transistors and a drain voltage supply coupled to respective source elements of said plurality of transistors, said monitoring means including means for monitoring a gate voltage of said gate voltage supply and output of a signal responsive thereto, said digital control means outputting said disable signal responsive to said monitored gate voltage exceeding predetermined first limits.

10. The hybrid system as recited in claim 9 where said monitoring means includes means for monitoring a drain voltage of said drain voltage supply and output of a signal responsive thereto, said digital control means outputting said disable signal responsive to said monitored drain voltage exceeding predetermined second limits.

11. The hybrid system as recited in claim 1 where said digital control means includes a digital data output for communicating said at least one fault condition to an external control system.

12. A hybrid system for control and monitoring of an amplifier, comprising:
   a power source, said power source providing a gate voltage supply, a drain voltage supply and a voltage reference;
   an amplifier coupled to said power source and having an amplification input, a gain control input, and an amplified output, said amplifier having a gain value varied responsive to a gain control signal input to said gain control input, said amplifier including a plurality of transistors, each of said plurality of transistors having a gate element coupled to said gate voltage supply, a drain element coupled to said drain voltage supply and a source element coupled to said voltage reference;
   switching means coupled between said drain voltage supply and said drain element of each of said plurality of transistors for coupling said drain voltage supply to said drain elements responsive to a switching control signal coupled to a switching control input of said switching means;
   analog control means having (a) a first input coupled to said amplification input for sensing an input signal amplitude, (b) a second input coupled to said amplified output for sensing an output signal amplitude, (c) an enabling input, and (d) an output coupled to said gain control input of said amplifier for maintaining a predetermined gain of said amplifier, said analog control means generating said gain control signal as a function of a measured gain value relative to a reference gain value and an enable signal input to said enabling input, said analog control means maintaining a minimal gain of said amplifier responsive to a disable signal input to said enabling input;
   monitoring means coupled to said amplifier for detecting a gate voltage of said gate voltage supply and output of a first digital signal responsive thereto, said monitoring means detecting a drain voltage of said drain voltage supply and outputting a second digital signal responsive thereto; and,
   digital control means having a plurality of inputs coupled to said monitoring means and a first output coupled to said enabling input of said analog control means and a second output coupled to said switching control input of said switching means, said digital control means outputting said switching control signal at said second output responsive to detection of said gate voltage and then in sequence changing an output at said first output of said digital control means from a disable signal to an enable signal responsive to detection of said drain voltage.

13. The hybrid system as recited in claim 12 where at least a portion of said plurality of transistors are coupled in parallel relationship, said digital control means outputting a signal at said gain change output for reducing said reference gain value by a predetermined increment responsive to a failure of one of said parallel coupled transistors.

14. The hybrid system as recited in claim 13 where said predetermined increment is approximately 3.0 db.

15. The hybrid system as recited in claim 12 where said monitoring means includes means for monitoring said output signal amplitude, said output signal amplitude monitoring means including at least one output coupled to one of said plurality of inputs of said digital control means for output of a signal to said digital control means representing a fault condition of said analog control means when said output signal amplitude exceeds predetermined limits, said digital control means outputting said disable signal responsive to said fault condition of said analog control means.

16. The hybrid system as recited in claim 15 where said monitoring means includes means for monitoring a reflected signal amplitude at said amplified output of said amplifier, said reflected signal amplitude monitoring means including at least one output coupled to one of said plurality of inputs of said digital control means for output of a signal to said digital control means representing a fault condition defined by a voltage standing wave ratio in excess of a predetermined limit, said digital control means outputting said disable signal responsive to said fault condition signal.

17. The hybrid system as recited in claim 16 where said digital control means includes a digital data output for communicating fault conditions to an external control system.

18. The hybrid system as recited in claim 12 where at least a portion of said plurality of transistors are silicon carbide transistors.

19. The hybrid system as recited in claim 12 where said amplifier includes a variable attenuator coupled to said amplification input and said gain control input, said variable attenuator being controlled to attenuate an input signal amplitude input to said amplification input responsive to said gain control signal input to said gain control input.

20. The hybrid system as recited in claim 19 where said analog control means outputs a gain control signal to drive said variable attenuator to substantially a maximum value responsive to output of said disable signal by said digital control means.

21. A power amplifier and control module, comprising:
   an amplifier including a plurality of silicon carbide transistors coupled between an input and output thereof, said amplifier including means for varying a gain value thereof responsive to an analog signal input to a gain control input;
   analog control means having a pair of sensing inputs respectively coupled to said input and output of said amplifier and having an output coupled to said gain control input, said analog control means generating said gain control signal as a function of a measured gain value relative to a reference gain value; and,
   digital control means having a plurality of inputs coupled to said amplifier for monitoring predetermined operating characteristics thereof, said digital control means having an output coupled to said analog control means for commanding said analog control means to vary said gain value to a predetermined value responsive to one or more of said predetermined operating characteristics exceeding predetermined limits therefor.

* * * * *